United States Patent
Shobha et al.

(10) Patent No.: US 10,692,755 B2
(45) Date of Patent: Jun. 23, 2020

(54) SELECTIVE DEPOSITION OF DIELECTRICS ON ULTRA-LOW K DIELECTRICS

(71) Applicant: International Business Machines Corporation, Armonk, NY (US)

(72) Inventors: Hosadurga Shobha, Niskayuna, NY (US); Rudy J. Wojtecki, San Jose, CA (US); Noel Arellano, Fremont, CA (US); Ekmini A. De Silva, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/169,121

(22) Filed: Oct. 24, 2018

(65) Prior Publication Data
US 2020/0135544 A1    Apr. 30, 2020

(51) Int. Cl.
| | | |
|---|---|---|
| *H01L 21/3205* | (2006.01) | |
| *H01L 21/768* | (2006.01) | |
| *H01L 21/027* | (2006.01) | |
| *H01L 21/311* | (2006.01) | |
| *H01L 21/033* | (2006.01) | |

(52) U.S. Cl.
CPC .... *H01L 21/76808* (2013.01); *H01L 21/0276* (2013.01); *H01L 21/0332* (2013.01); *H01L 21/31116* (2013.01); *H01L 21/31138* (2013.01)

(58) Field of Classification Search
CPC ......... H01L 21/76877; H01L 21/76224; H01L 21/76802; H01L 21/76834; H01L 21/31144; H01L 2924/0002; H01L 23/5329; H01L 23/53266; H01L 23/5283; H01L 21/76831; H01L 21/76843; H01L 21/32051; H01L 23/5226; H01L 27/11556; H01L 29/4966
See application file for complete search history.

(56) References Cited

U.S. PATENT DOCUMENTS

| | | | |
|---|---|---|---|
| 6,133,108 | A | 10/2000 | New |
| 6,900,123 | B2 | 5/2005 | Jiang et al. |
| 7,375,027 | B2 | 5/2008 | Tsai et al. |
| 9,508,545 | B2 | 11/2016 | Chen et al. |
| 9,895,715 | B2 | 2/2018 | Haukka et al. |
| 9,911,591 | B2 | 3/2018 | Thompson et al. |

(Continued)

OTHER PUBLICATIONS

Benjamin D. Briggs et al., "Fully Aligned Via Integration for Extendibility of Interconnects to Beyond the 7 nm Node," International Electron Devices Meeting (IEDM), 2017, 14.2, 4 pp.

(Continued)

*Primary Examiner* — Caridad Everhart
(74) *Attorney, Agent, or Firm* — Cantor Colburn LLP; Vazken Alexanian

(57) ABSTRACT

A method for fabricating a semiconductor device includes forming a via in a first dielectric layer arranged on a metal layer. The via exposes a portion of the metal layer. The method includes forming a trench in the first dielectric layer. The method further includes depositing, by a selective process, a second dielectric layer on the first dielectric layer such that the second dielectric layer lines sidewalls of the via and the trench and is selectively deposited onto the first dielectric layer.

17 Claims, 17 Drawing Sheets

(56) References Cited

U.S. PATENT DOCUMENTS

| | | | |
|---|---|---|---|
| 2004/0241463 A1* | 12/2004 | Vincent | C03C 3/045 428/447 |
| 2015/0140753 A1* | 5/2015 | Simsek-Ege | H01L 27/1157 438/268 |
| 2016/0172189 A1 | 6/2016 | Tapily | |
| 2018/0012752 A1 | 1/2018 | Tapily | |

OTHER PUBLICATIONS

Fatemeh Sadat Minaye Hashemi et al., "Selective Deposition of Dielectrics: Limits and Advantages of Alkanethiol Blocking Agents on Metal—Dielectric Patterns," ACS Applied Materials & Interfaces, vol. 8, No. 48, 2016, pp. 33264-33272.

* cited by examiner

SELECTIVE DEPOSITION OF DIELECTRICS ON ULTRA-LOW K DIELECTRICS

BACKGROUND

The present invention generally relates to fabrication methods and resulting structures for semiconductor devices. More specifically, the present invention relates to selective deposition of dielectrics on ultra-low k dielectrics.

Advancements in semiconductor fabrication have enabled the manufacture of integrated circuits with high densities of electronic components. However, the increasing numbers and lengths of interconnect wirings can increase circuit resistance-capacitance delay and power consumption, which could impact circuit performance.

Three-dimensional (3D) stacking of integrated circuits addresses the afore-mentioned challenges. Fabricating 3D integrated circuits includes vertically stacking wafers to form a multilevel structure. Vertically stacking the wafers can reduce interconnect wiring length and increase semiconductor device density.

A typical process for fabricating a single wafer level in a multilevel structure includes depositing a dielectric material, patterning the dielectric material to form openings (including trenches and vias), depositing a conductive material onto the wafer in sufficient thickness to fill the openings, and removing excessive conductive material from the surface using a chemical, mechanical, or combined chemical-mechanical polishing techniques.

SUMMARY

Embodiments of the present invention are directed to a method for fabricating a semiconductor device. A non-limiting example of the method includes forming a via in a first dielectric layer arranged on a metal layer. The via exposes a portion of the metal layer. The method includes forming a trench in the first dielectric layer. The method further includes depositing, by a selective process, a second dielectric layer on the first dielectric layer such that the second dielectric layer lines sidewalls of the via and the trench and is selectively deposited onto the first dielectric layer.

Another non-limiting example of the method includes forming an opening through a metal layer and a first dielectric layer. The method further includes depositing, by a selective process, a second dielectric layer on the first dielectric layer such that the second dielectric layer lines sidewalls of the opening and is selectively deposited onto the first dielectric layer.

Embodiments of the invention are directed to a semiconductor device. A non-limiting example of the semiconductor device includes an opening within a first dielectric layer that extends to and exposes a portion of a metal layer. The semiconductor device further includes a second dielectric layer selectively contacting the first dielectric layer and lining sidewalls of the trench.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-7 depict a process flow for fabricating a semiconductor device according to embodiments of the present invention, in which:

FIG. 1 depicts a cross-sectional side view of the semiconductor device subsequent to depositing a cap layer on a metal layer;

FIG. 2 depicts a cross-sectional side view of the semiconductor device subsequent to depositing an ultra-low k dielectric layer, a hard mask layer, and a metal layer on the cap layer;

FIG. 4 depicts a cross-sectional side view of the semiconductor device subsequent to forming a self-assembled monolayer on exposed metal layers;

FIG. 5 depicts a cross-sectional side view of the semiconductor device subsequent to selectively depositing a dielectric layer on the ultra-low k layer;

FIG. 7 depicts a cross-sectional side view of the semiconductor device subsequent to depositing a metal in the via and the trenches;

FIGS. 8-14 depict a process flow for fabricating a semiconductor device according to embodiments of the present invention, in which:

FIG. 8 depicts a cross-sectional side view of the semiconductor device subsequent to depositing a metal layer, hard mask layer, and ultra-low k dielectric layer on a cap layer and metal layer;

FIG. 9 depicts a cross-sectional side view of the semiconductor device subsequent to forming a via in the ultra-low k dielectric layer and patterning the metal layer and the hard mask layer;

FIG. 10 depicts a cross-sectional side view of the semiconductor device subsequent to forming a self-assembled monolayer on the exposed metal layers;

FIG. 11 depicts a cross-sectional side view of the semiconductor device subsequent to selectively depositing a dielectric layer in the via;

FIG. 12 depicts a cross-sectional side view of the semiconductor device subsequent to removing the self-assembled monolayer from the exposed metal layers;

FIG. 14 depicts a cross-sectional side view of the semiconductor device subsequent to depositing a metal in the via and the trenches.

Figure 1:
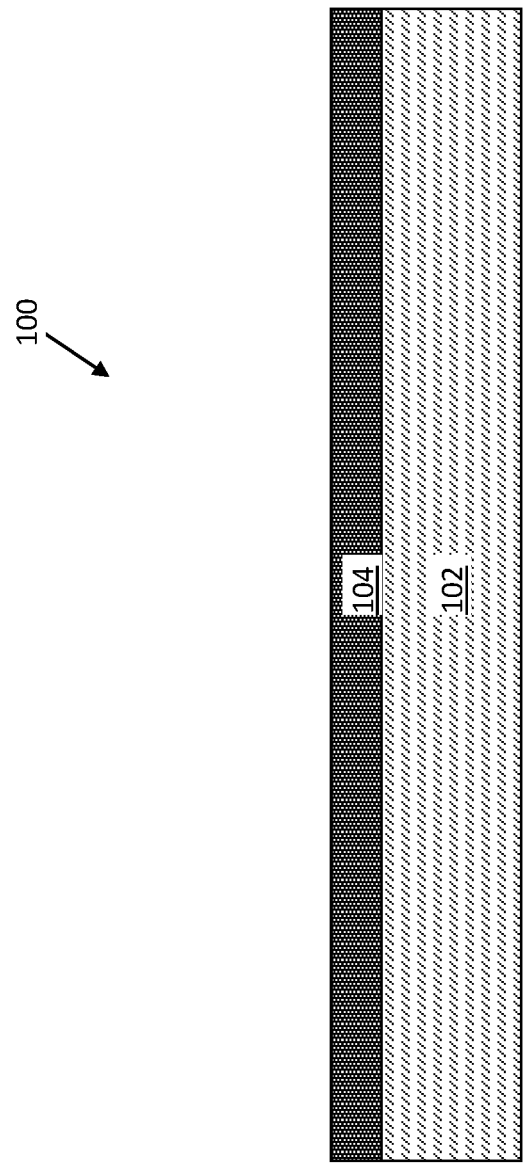

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, features such as vias and trenches are formed in dielectric layers of a multilevel structure. Processes used to form the vias and trenches, for example etching (e.g., reactive ion etching (RIE)), can damage the sidewalls and increase the critical dimension (CD) of the vias and trenches, which can degrade device performance and reliability, increase capacitance and via shorting, and induce liner layer diffusion into the dielectric layer. Despite these drawbacks, strengthening the dielectric layer after forming the vias and the trenches, without affecting the metal areas, is challenging because after the trench and via are formed, strengthening the dielectric, by for example UV treatment or non-selective liner deposition of other process, will also impact the exposed metal lines in the contact area and increase contact resistance.

Turning now to an overview of the aspects of the invention, one or more embodiments of the invention address the above-described shortcomings of the prior art by providing methods for forming and resulting semiconductor devices in which a dielectric material is selectively deposited onto the dielectric layer in which the vias and the trenches are formed. The dielectric material covers the sidewalls of the via and/or the trenches. The dielectric material is selectively grown on the dielectric layer, without being deposited on the exposed metal contact areas, which could inhibit proper contact formation.

The above-described aspects of the invention address the shortcomings of the prior art by protecting the via sidewalls from damage induced by subsequent formation of the trenches in some embodiments of the present invention. In other embodiments of the present invention, the dielectric material prevents liner diffusion into the dielectric layer in both the via and the trenches.

Turning now to a more detailed description of aspects of the present invention, FIGS. 1-7 depict a process flow for fabricating a semiconductor device 100 according to embodiments of the present invention. FIG. 1 depicts a cross-sectional side view of the semiconductor device subsequent to depositing a cap layer 104 on a metal layer 102. The metal layer 102 is a wiring level. The metal layer 102 includes one or more metals, including, but not limited to, copper (Cu), aluminum (Al), or tungsten (W). The metal(s) are deposited by a suitable deposition method, including for example, electroplating, electroless plating, chemical vapor deposition (CVD), physical vapor deposition (PVD), or a combination thereof.

The cap layer 104 is deposited on metal layer 102. The cap layer 104 can include both metal and insulator layers, or only an insulator layer. The metal cap layer can include, but is not limited to, cobalt (Co), ruthenium (Ru), tantalum (Ta), cobalt tungsten phosphorus (CoWP), or any combination thereof. The dielectric cap materials include silicon nitride, silicon carbide, nitrogen doped silicon carbide, oxygen doped silicon carbide or the like which can function as both a barrier to metal layer 102 and dielectric layer 202 and an etch stop for a subsequent via level. In an embodiments of the present invention, the first cap layer 104 includes a dielectric material such as nitrogen-doped silicon carbide.

Figure 2:
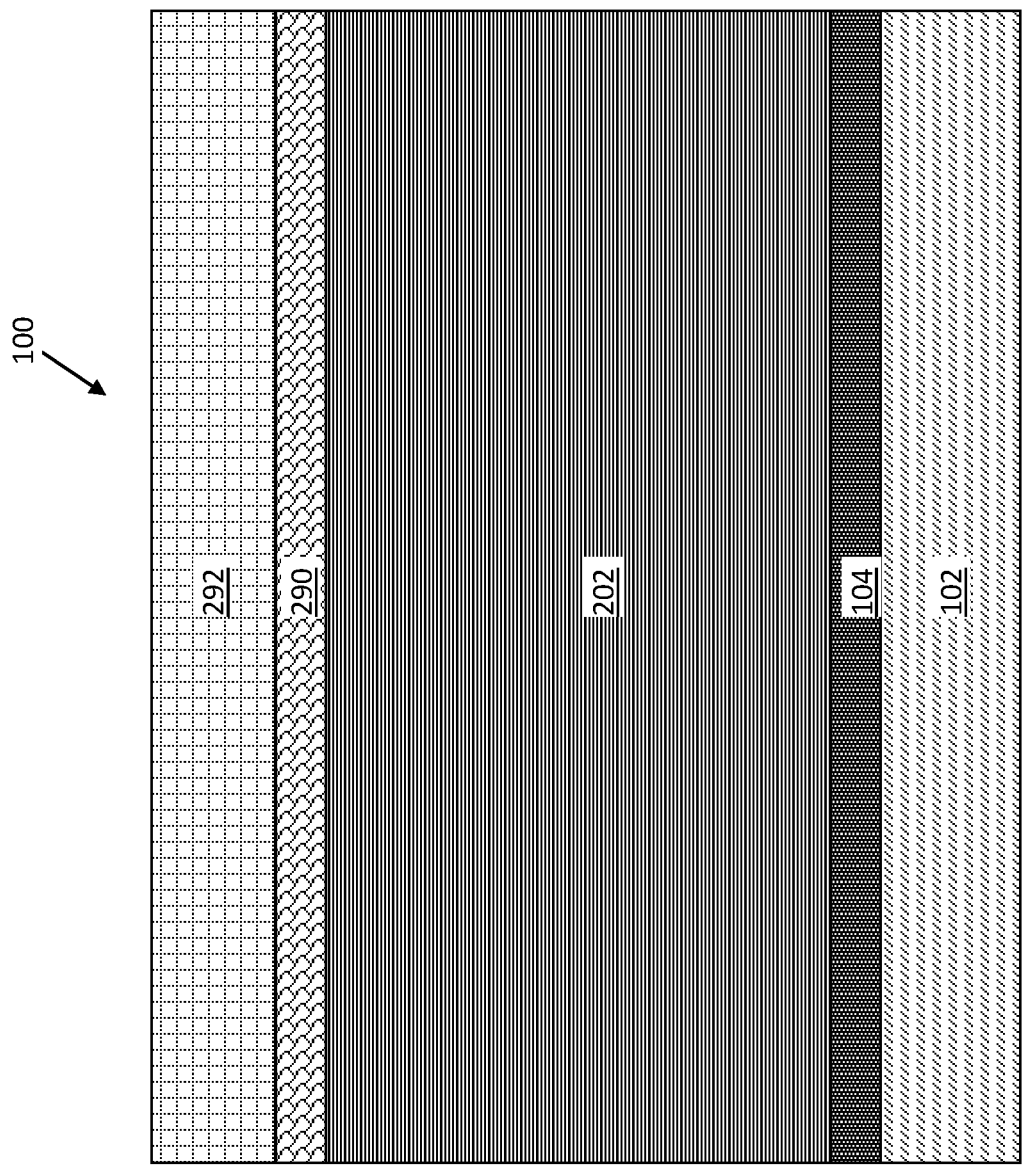

FIG. 2 depicts a cross-sectional side view of the semiconductor device 100 subsequent to depositing an ultra-low k dielectric layer 202, a hard mask layer 290, and a metal layer 292 on the cap layer 104. The ultra-low k dielectric layer 202 is also referred to as the first dielectric layer herein. The ultra-low k dielectric layer 202 has a dielectric constant (k) value of about 1.8 to about 4.0 according to one or more embodiments of the present invention. According to other embodiments of the present invention, the ultra-low k dielectric layer 202 has a k value of about 2.0 to about 2.7. Non-limiting examples of materials for the ultra-low k dielectric layer 202 include an dielectric material including, but not limited to, silicon oxide ($SiO_2$), hydrogenated silicon carbon oxide (SiCOH), SiCH, SiCNH, or other types of silicon-based low-k dielectrics (e.g., k less than about 4.0), porous dielectrics, or known ULK (ultra-low-k) dielectric materials (with k less than about 2.5).

Non-limiting examples of suitable materials for the hard mask layer 290 include silicon oxide, silicon nitride, or any combination thereof.

The metal layer 292 includes a metal or metal containing compound. Non-limiting examples of materials for the metal layer 292 include titanium, titanium nitride, tantalum, tantalum nitride, tungsten, niobium, cobalt, cobalt titanium, nickel, platinum, or any combination thereof.

Figure 3A:
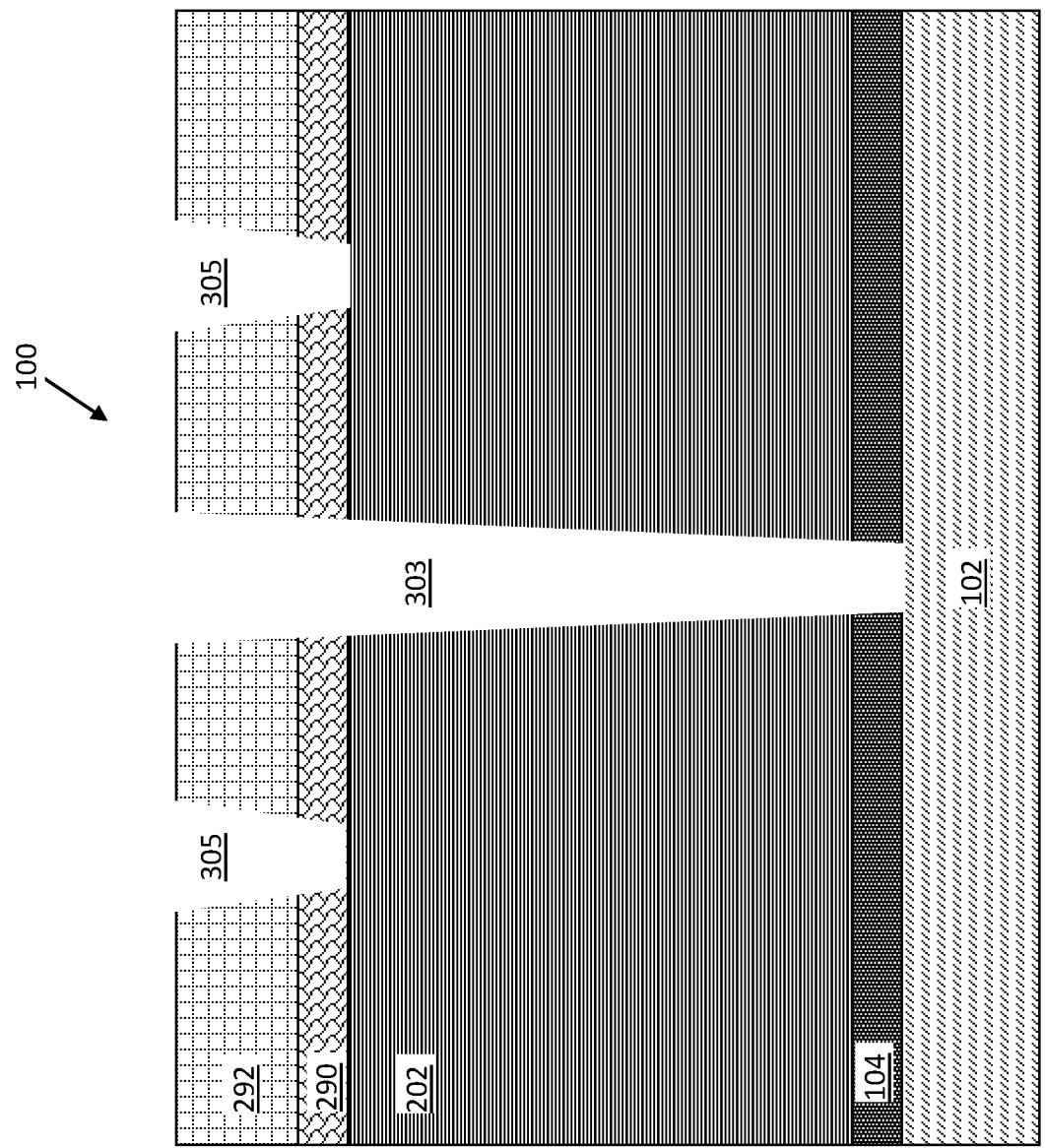
FIG. 3A depicts a cross-sectional side view of the semiconductor device subsequent to forming a via in the ultra-low k dielectric layer and patterning the metal layer and the hard mask layer.

FIG. 3A depicts a cross-sectional side view of the semiconductor device 100 subsequent to forming a via 303 in the ultra-low k dielectric layer 202 and patterning the metal layer 292 and the hard mask layer 290. The via 303 is an opening in the ultra-low k dielectric layer 202 that is formed by one or more patterning techniques, such as for example, a lithography technique, followed by an technique to remove the ultra-low k dielectric layer 202 material to form the opening. To form the via 303, portions of the metal layer 292, hard mask layer 290, ultra-low k dielectric layer 202, and cap layer 104 are removed, such that the via 303 extends to and exposes the metal layer 102 according to some embodiments of the present invention. Yet, in other embodiments of the present invention, the via 303 extends into and stops at the cap layer 104. Although one via 303 is shown, any number of vias 303 can be formed in the ultra-low k dielectric layer 202.

Figure 3B:
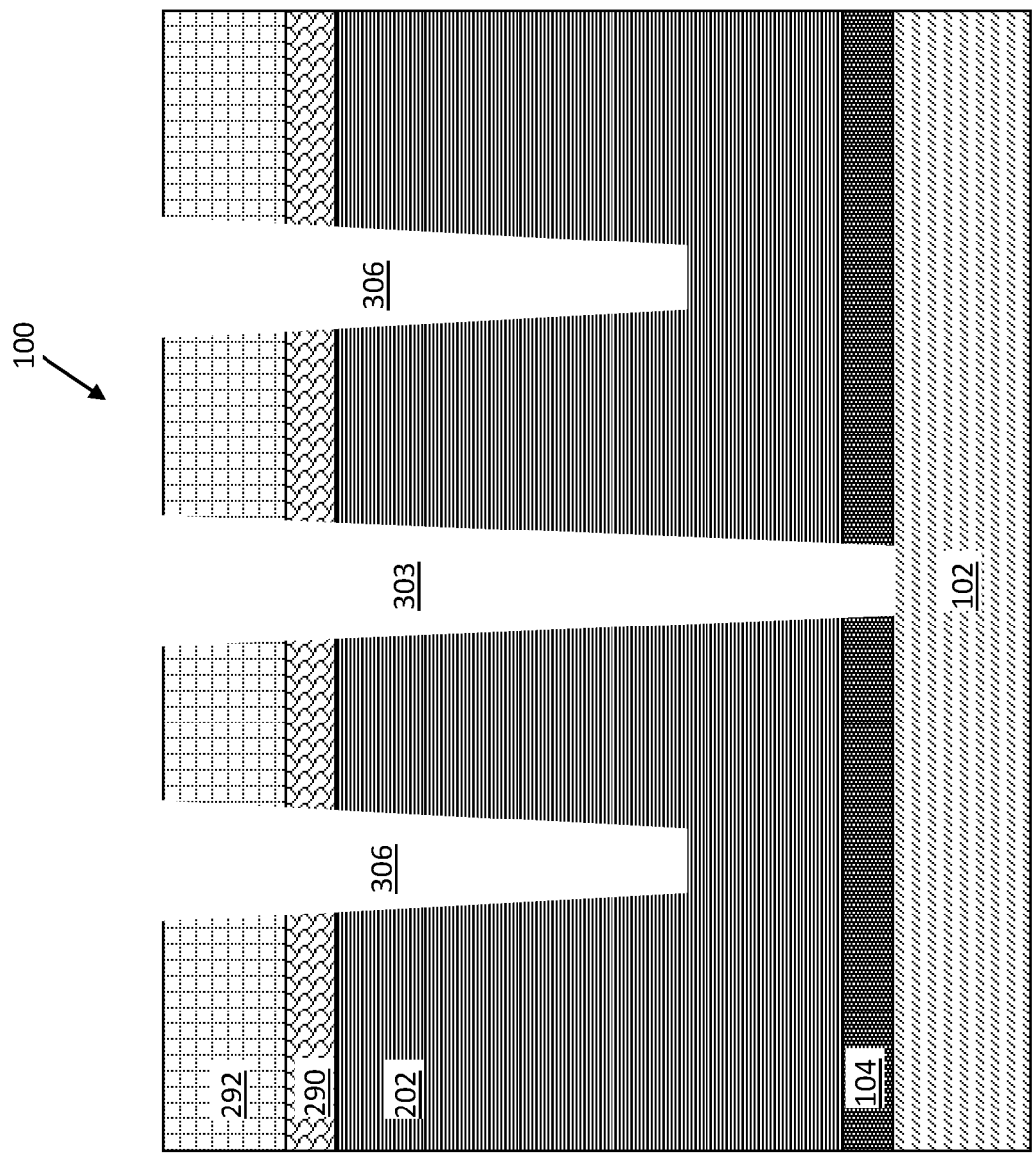
FIG. 3B depicts a cross-sectional side view of the semiconductor device subsequent to forming trenches in the ultra-low k dielectric layer.

The metal layer 292 and hard mask layer 290 are patterned with openings 305 that will be used to form trenches 306 (see FIG. 3B). To form the openings 305, portions of the metal layer 292 and hard mask layer 290 are removed. Although two openings 305 are shown, any number of openings 305 can be formed. According to one or more embodiments of the present invention, RIE is used to form the via 303 and the openings 305.

FIG. 3B depicts a cross-sectional side view of the semiconductor device 100 subsequent to forming trenches 306 in the ultra-low k dielectric layer 202. The pattern of the openings 305 are used to form the trenches 306 by removing portions of the ultra-low k dielectric layer 202. The trenches 306 stop within the ultra-low k dielectric layer 202. Although two openings 305 are shown, any number of openings 305 are formed. According to one or more embodiments of the present invention, RIE is used to form the trenches 306.

Figure 4:
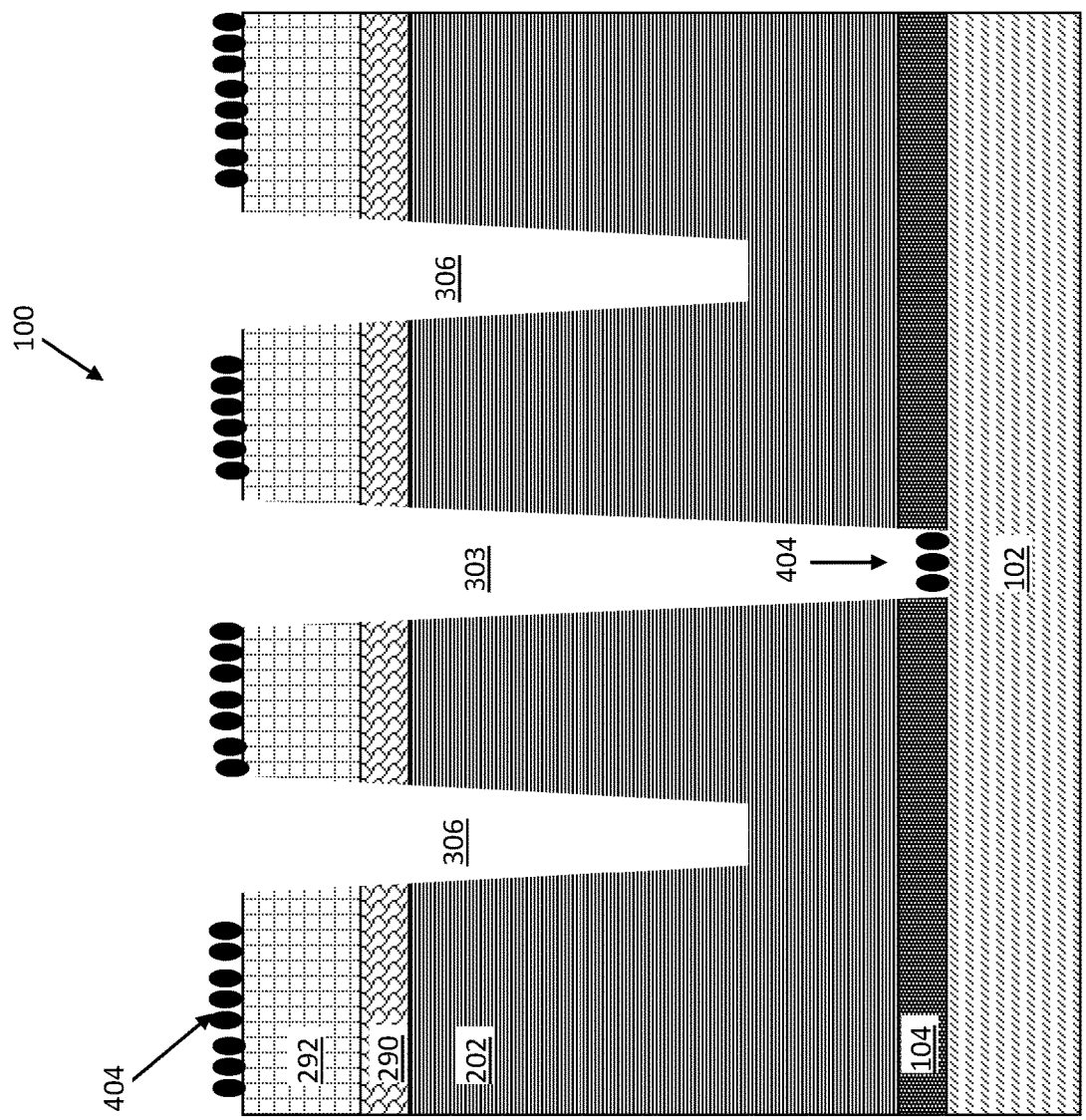

FIG. 4 depicts a cross-sectional side view of the semiconductor device 100 subsequent to, optionally, selectively forming a self-assembled monolayer (SAM) 404 on exposed metal layers 102, 292. The SAM 404 deactivates the exposed areas of the metal layers 102, 292 at the end of the via 303, when the metal layer 102 is exposed.

The SAM 404 includes an organic polymer. Non-limiting examples of materials for the SAM 404 include, for example, phosphonic acid based materials. SAM 404 or polymeric brushes can be functionalized with a phosphonic acid head group to bind selectively to metals. The body of the SAM 404 can include an alkyl group ranging from carbon atoms 6-18, an aryl group, or an alkyl/aryl mix. According to one or more embodiments of the present invention, the SAM 404 is deposited using a solution or vapor based deposition method.

Figure 5:
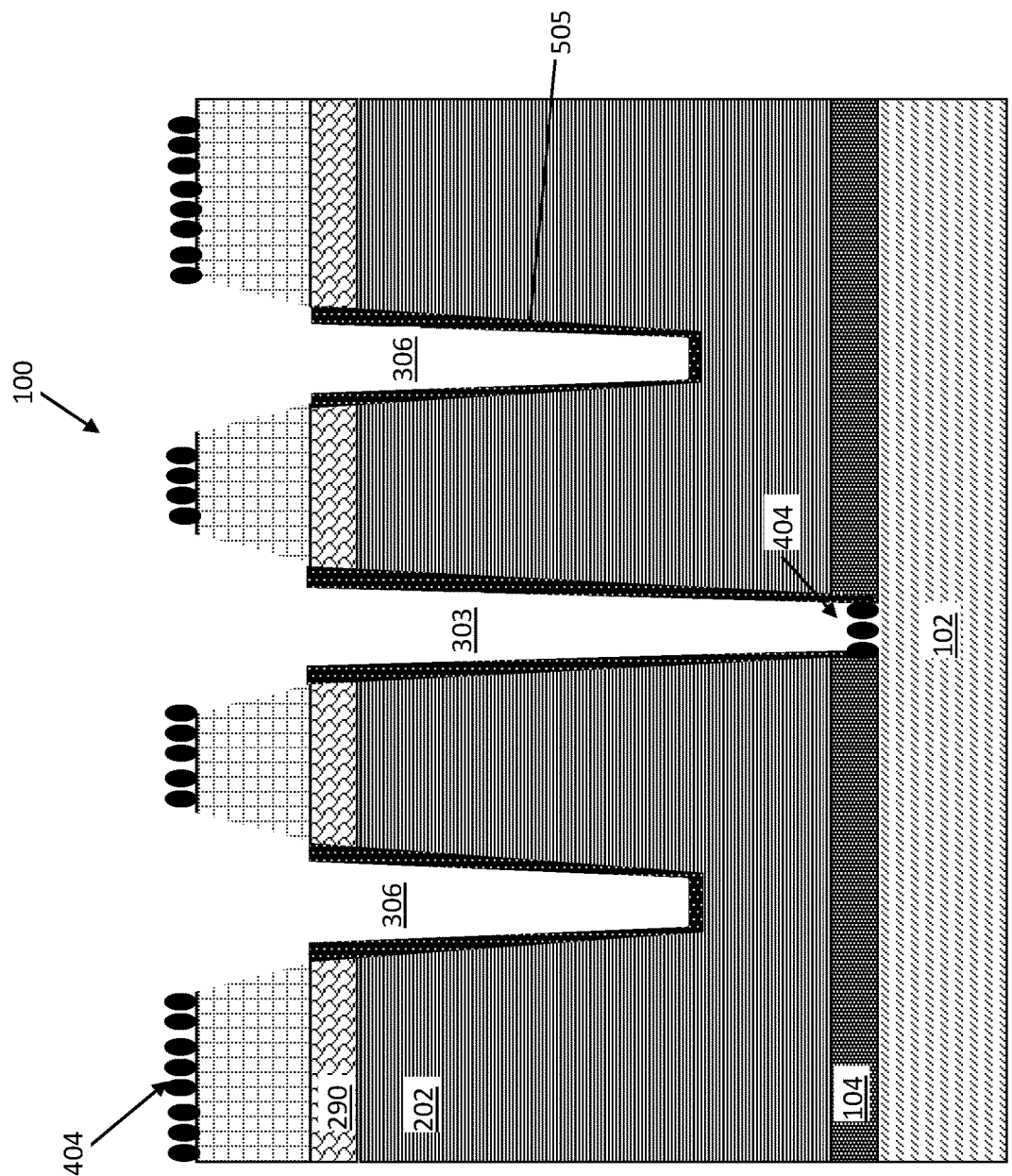

FIG. 5 depicts a cross-sectional side view of the semiconductor device 100 subsequent to selectively depositing a dielectric layer 505 on the ultra-low k dielectric layer 202. The dielectric layer 505 is also referred to as the second dielectric layer herein. The SAM 404, when present, protects the exposed metal layers 102, 292, such that the dielectric layer 505 is selectively deposited only on exposed sidewalls of the via 303 and the trenches 306. The dielectric layer 505 can also be deposited on exposed sidewalls of the hard mask layer 290.

The dielectric layer 505 has a low k value of about 3 to about 7 according to one or more embodiments of the present invention. According to other embodiments of the present invention, the dielectric layer 505 has a k value of less than 5.

Non-limiting examples of materials for the dielectric layer 505 include $SiO_2$, SiN, SiOC, hydrogenated silicon carbon oxide (SiCOH), SiCH, SiCNH, a high density plasma oxide, borophosphosilicate glass (BPSG), metal oxides (e.g., $TiO_2$, TiSiO, ZrO, ZnO or $Al_2O_3$), or any combination thereof. The dielectric layer 505 is deposited by a suitable deposition process, including, but not limited to CVD, PVD, plasma enhanced CVD, atomic layer deposition (ALD), evaporation, chemical solution deposition, or like processes. According to other embodiments of the present invention, the dielectric layer 505 has a thickness of less than 3 nm.

Although the dielectric layer 505 can be deposited after depositing the SAM 404 on the exposed metal areas, according to one or more embodiments of the present invention, the dielectric layer 505 is deposited directly onto the ultra-low k dielectric layer 202 (and into the via 303 and the trenches 306) without using the SAM 404 to protect the exposed metal. For example, precursors with a higher inherent reactivity on dielectrics compared to metals can be used.

According to exemplary embodiments of the present invention, $Al_2O_3$ has a higher inherent reactivity on $SiO_2$ compared to Cu, and therefore selectively deposits onto $SiO_2$ without protecting the exposed Cu.

Figure 6A:
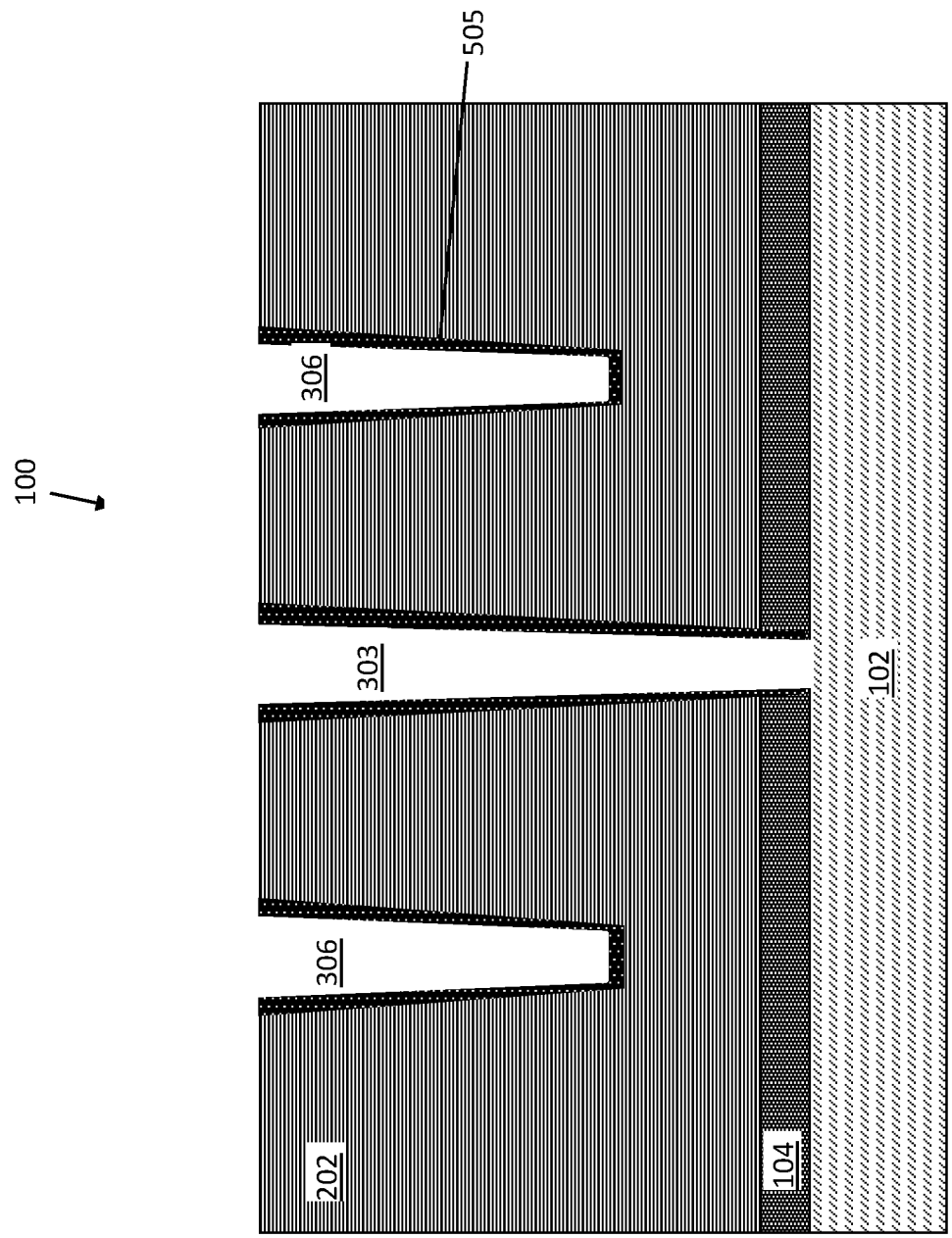
FIG. 6A depicts a cross-sectional side view of the semiconductor device subsequent to removing the self-assembled monolayer, the hard mask layer, and the metal layer.
Figure 6B:
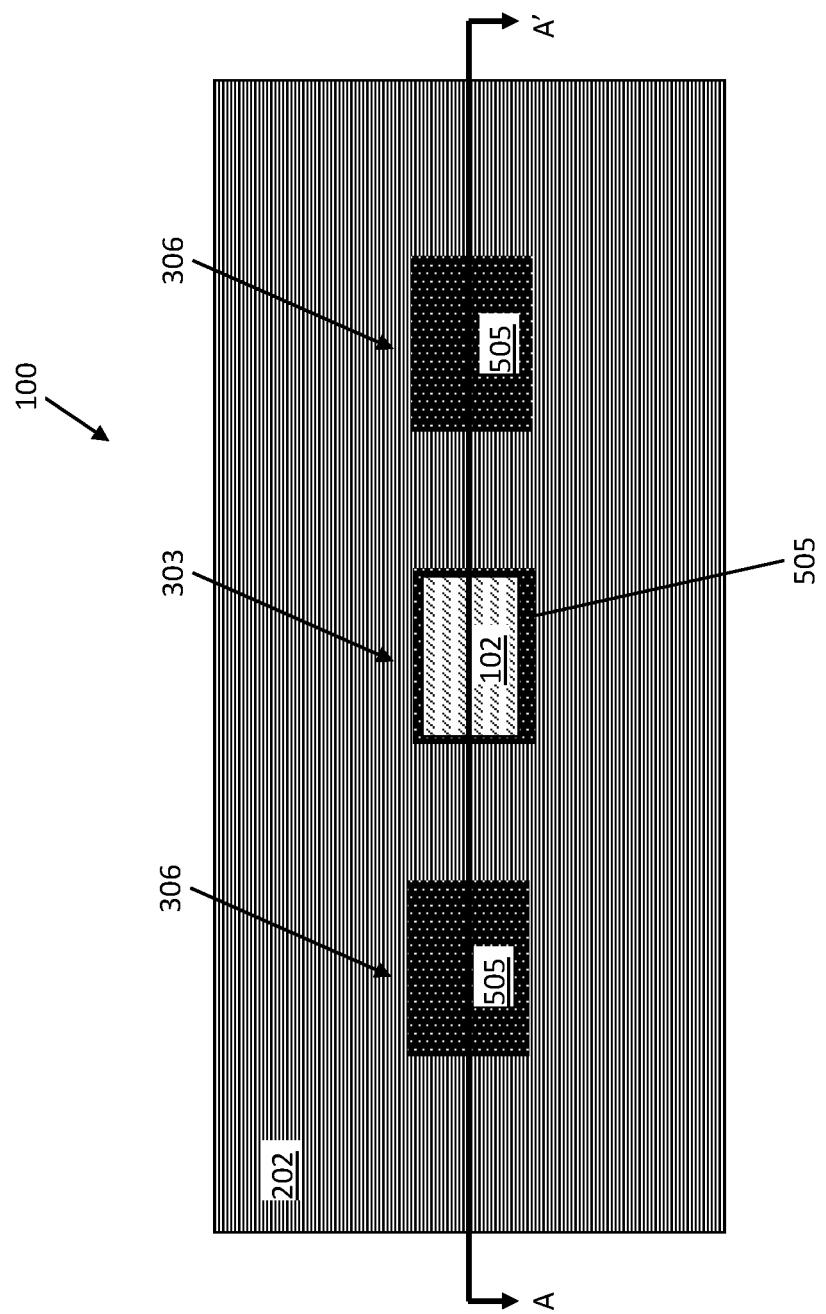
FIG. 6B depicts a top view of the semiconductor device shown in FIG. 6A, which shows a view through the axis A-A'.

FIG. 6A depicts a cross-sectional side view of the semiconductor device 100 subsequent to removing the SAM 404, the hard mask layer 290, and the metal layer 292. FIG. 6B depicts a top view of the semiconductor device 100 shown in FIG. 6A, which shows a view through the axis A-A'.

Figure 7:
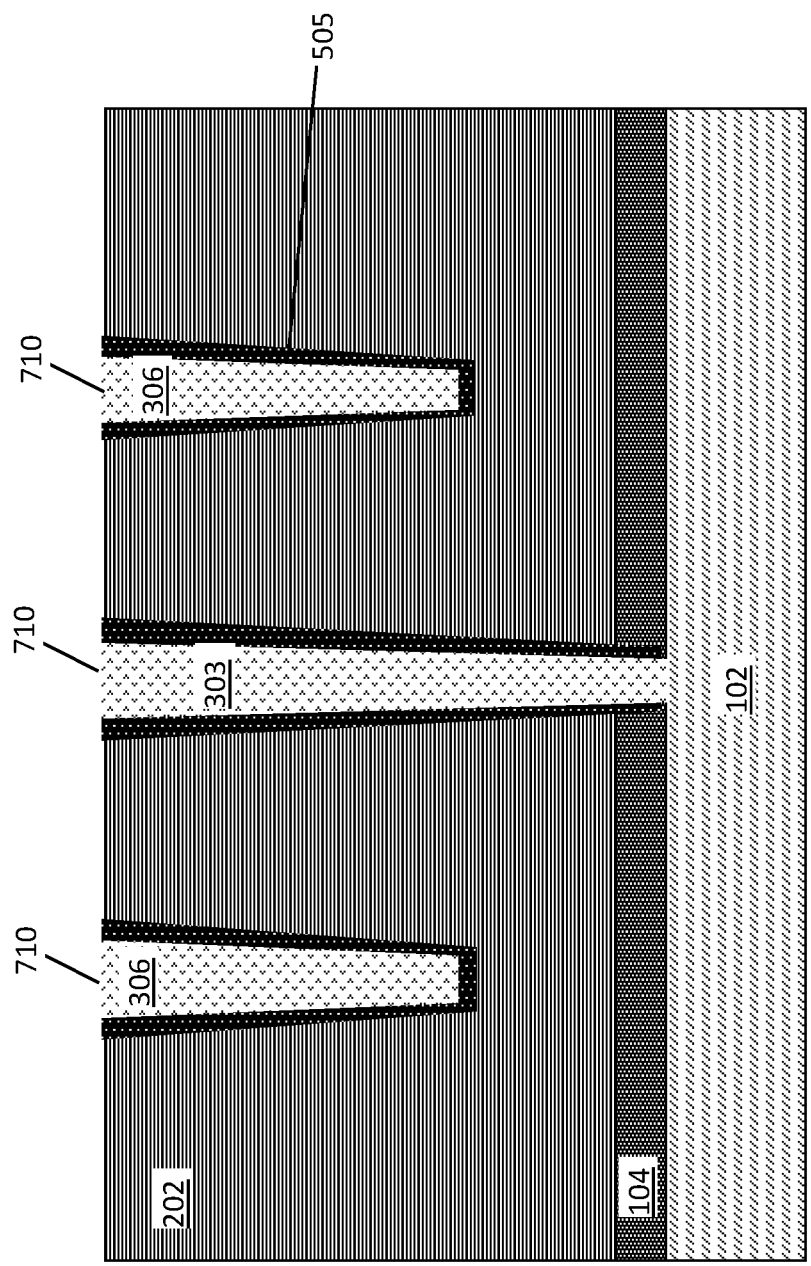

When the SAM 404 is used to protect the exposed metal layers 102, 292, the SAM 404 is removed prior to depositing metal into the via 303 and trenches 306 (as shown in FIG. 7). The methods used to remove the SAM 404 depends on the composition of the SAM.

According to some embodiments of the present invention, an etch process including acetic acid is used to remove the SAM 404 from the metal layers 102, 292. According to other embodiments of the present invention, an etch process that is not based on oxygen ($O_2$) or fluorine (F) is used to remove the SAM 404 from the metal layers 102, 292. The hard mask layer 290 and metal layer 292 are also removed by one or more etch processes.

FIG. 7 depicts a cross-sectional side view of the semiconductor device 100 subsequent to depositing a metal 710 in the via 303 and the trenches 306. Metal 710 includes one or more metals or metal containing compounds, which can include a liner layer. The metal 710 can include, for example, copper (Cu), aluminum (Al), or tungsten (W). The metal 710 can be deposited using a filling technique such as electroplating, electroless plating, CVD, PVD, or a combination thereof. After deposition, a planarization method, such as chemical mechanical planarization (CMP) is used to remove excess metal from the surface of the ultra-low k dielectric layer 202.

Figure 8:
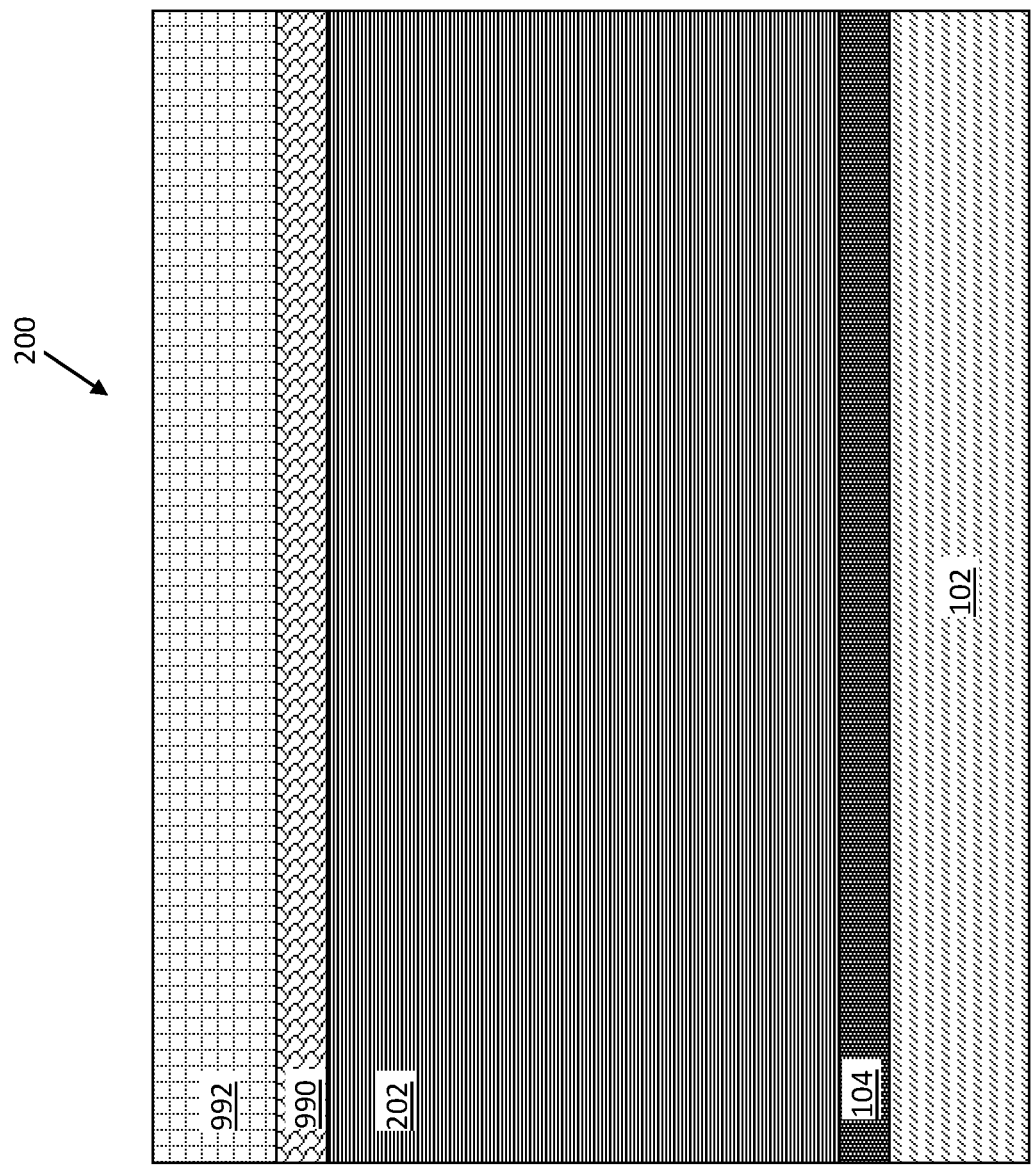

FIGS. 8-14 depict a process flow for fabricating a semiconductor device 200 according to embodiments of the present invention. FIG. 8 depicts a cross-sectional side view of a metal layer 292, hard mask layer 290, and ultra-low k dielectric layer 202 arranged on a cap layer 104 and a metal layer 102.

Figure 9:
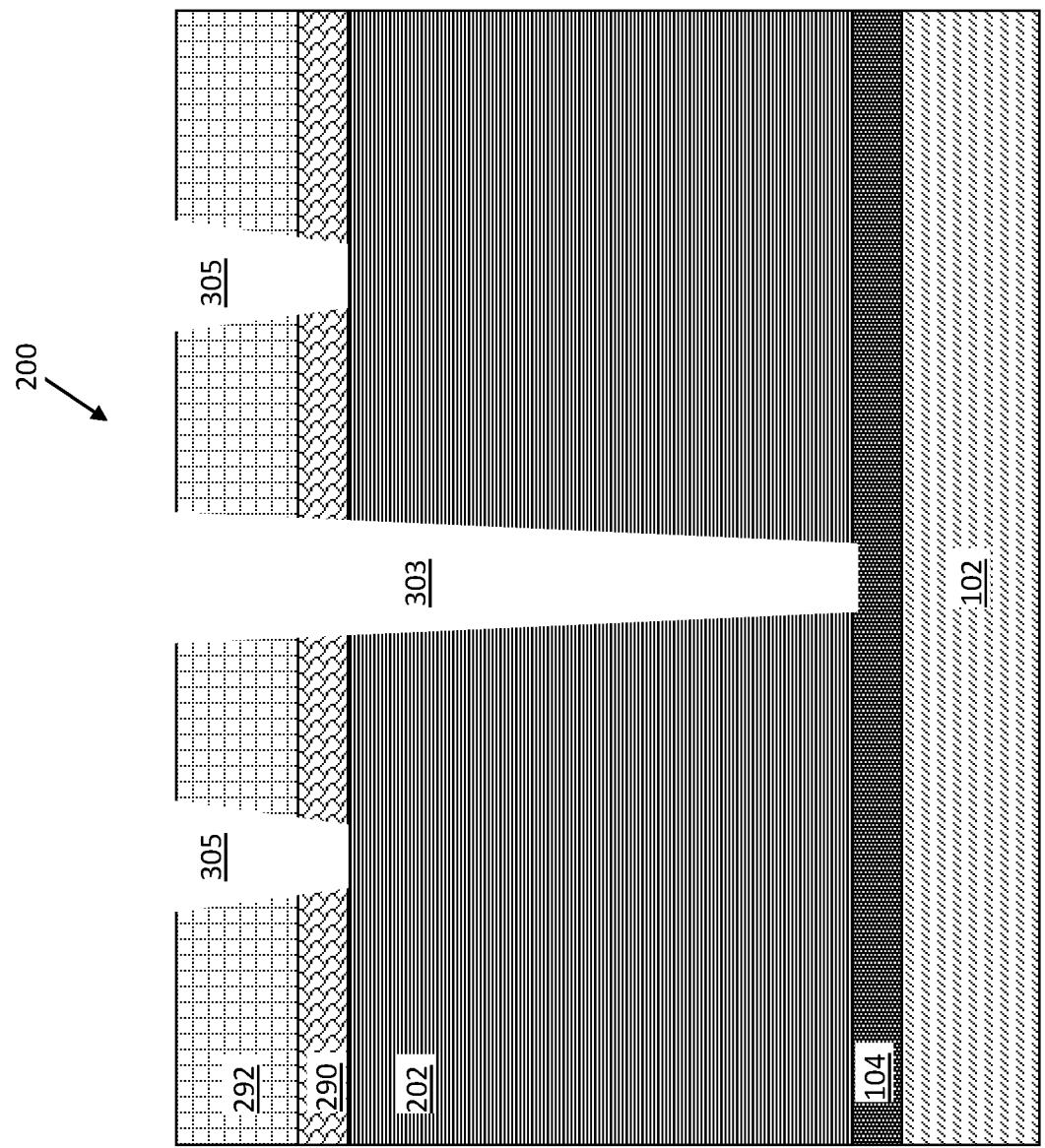

FIG. 9 depicts a cross-sectional side view of the semiconductor device 200 subsequent to forming a via 303 in the ultra-low k dielectric layer 202 and patterning the metal layer 292 and the hard mask layer 290. The via 303 is an opening in the ultra-low k dielectric layer 202 that is formed by one or more patterning techniques, such as for example, a lithography technique, followed by an technique to remove the ultra-low k dielectric layer 202 material to form the opening. To form the via 303, portions of the metal layer 292, hard mask layer 290, ultra-low k dielectric layer 202, and cap layer 104 are removed, such that the via 303 extends to and exposes the metal layer 102 according to one or more embodiments of the present invention. Although one via 303 is shown, any number of vias 303 can be formed in the ultra-low k dielectric layer 202.

Figure 13A:
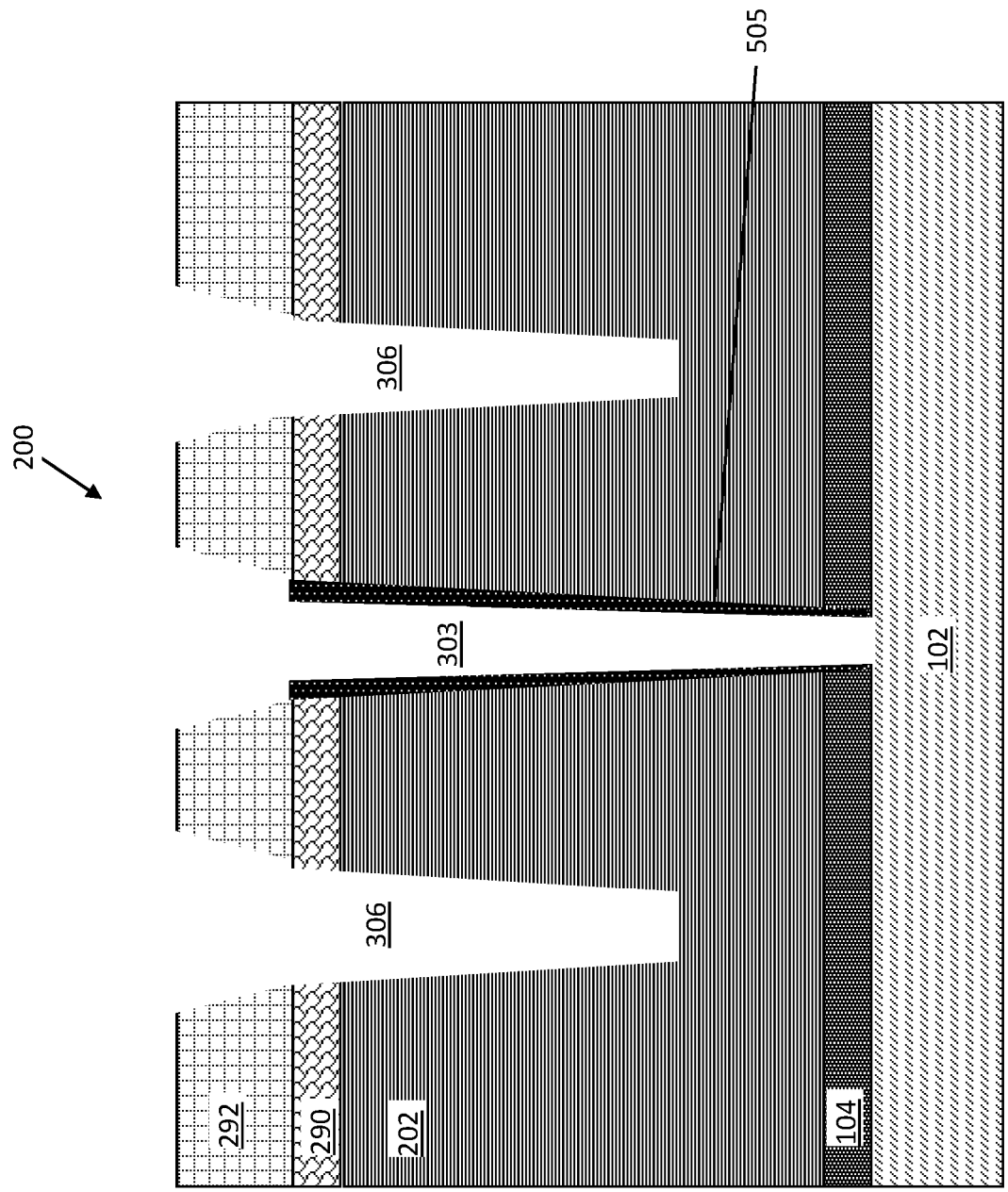
FIG. 13A depicts a cross-sectional side view of the semiconductor device subsequent to forming a pair of trenches in the ultra-low k dielectric layer.

The metal layer 292 and hard mask layer 290 are patterned with openings 305 that will be used to form trenches 306 (see FIG. 13A). To form the openings 305, portions of the metal layer 292 and hard mask layer are removed. Although two openings 305 are shown, any number of openings 305 can be formed. According to one or more embodiments of the present invention, RIE is used to form the via 303 and the openings 305.

Figure 10:
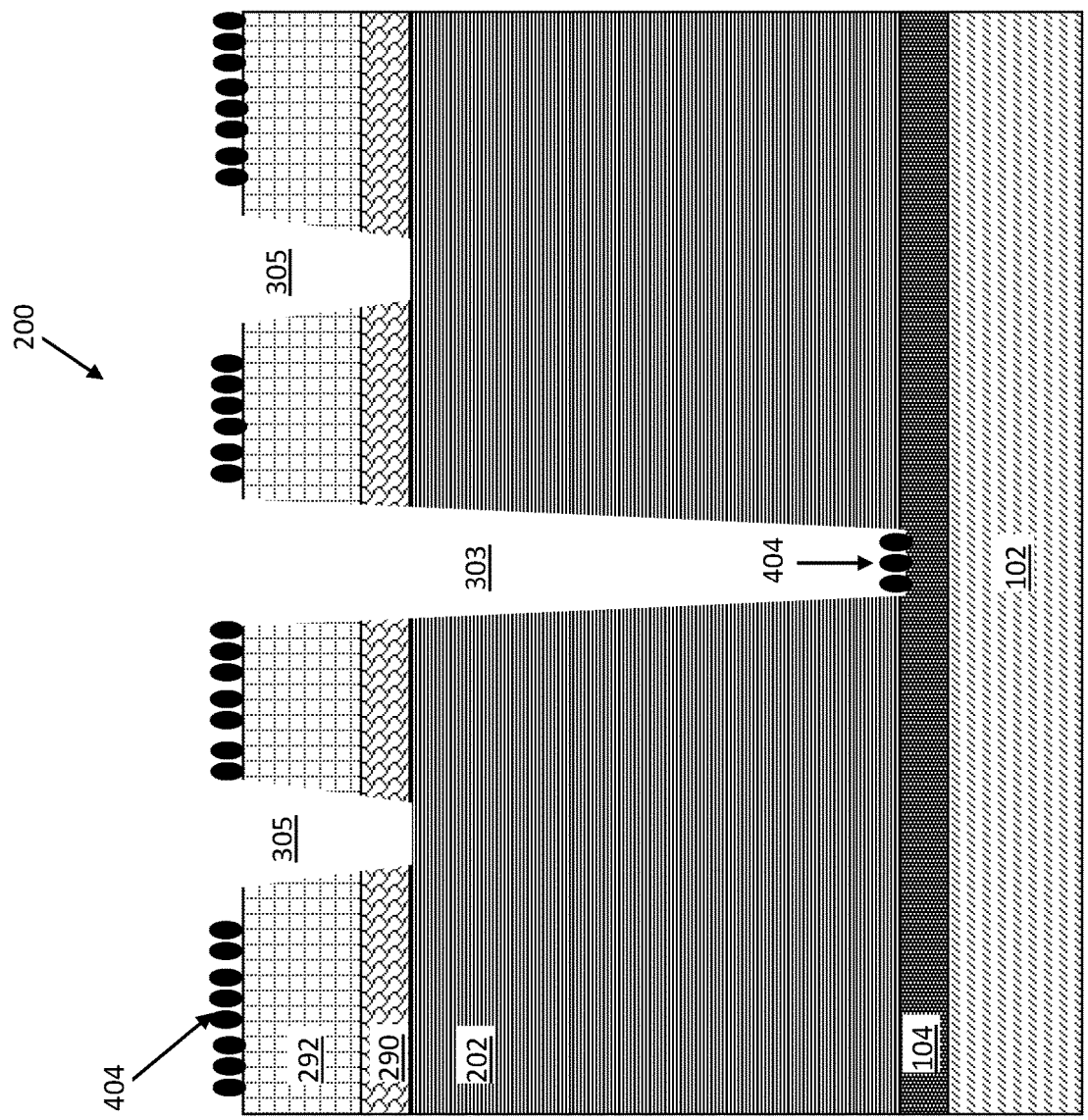

FIG. 10 depicts a cross-sectional side view of the semiconductor device 200 subsequent to, optionally, forming a SAM 1104 on the exposed metal layers 102, 292. The SAM 404 deactivates the exposed surfaces of the metal layers 102, 292. The SAM 404 includes an organic polymer.

Figure 11:
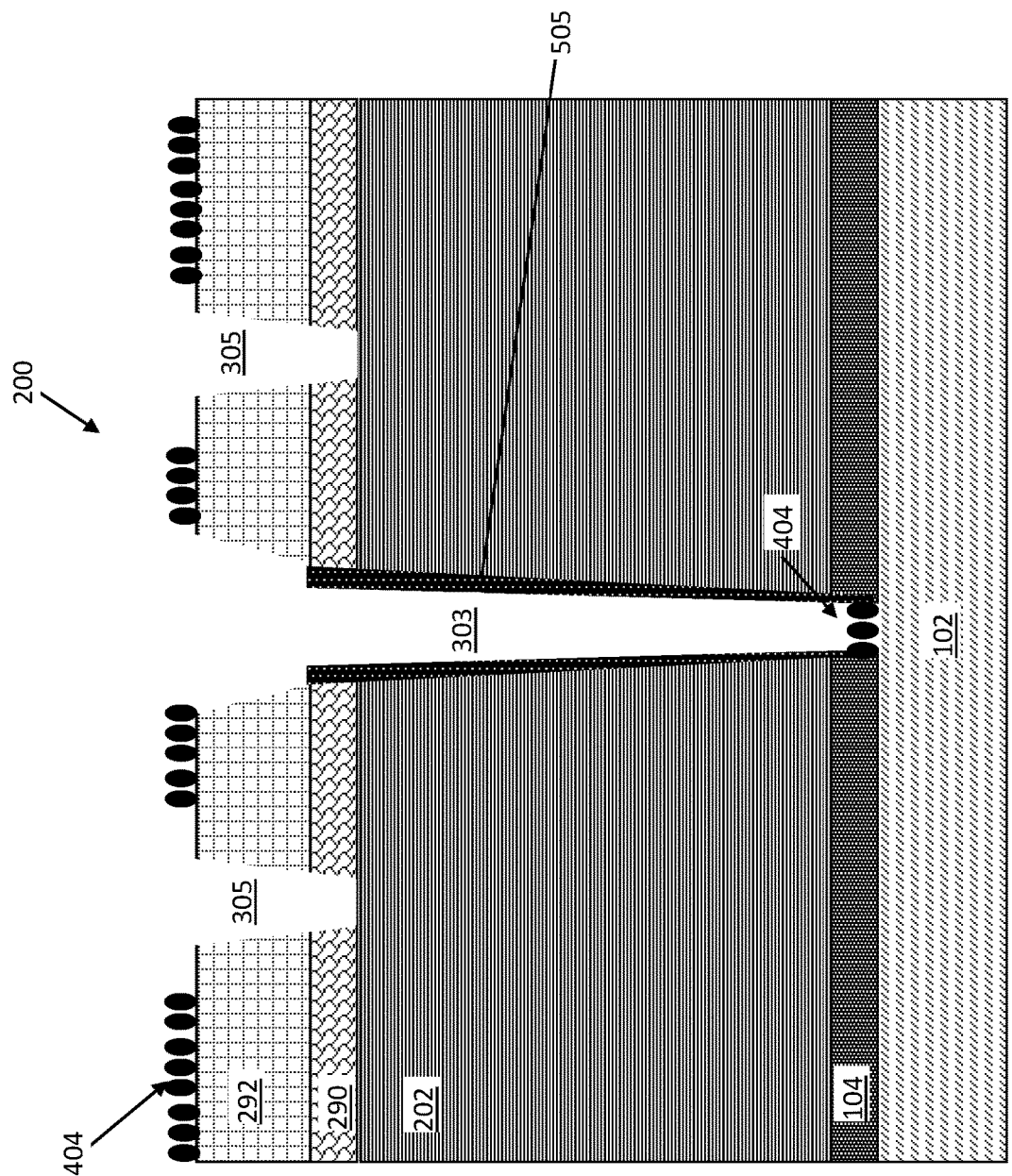

FIG. 11 depicts a cross-sectional side view of the semiconductor device 200 subsequent to selectively depositing a dielectric layer 505 in the via 303. The SAM 404 protects the exposed metal layers 102, 292, and the dielectric layer 505 is selectively deposited only on exposed sidewalls of the via 303.

Although the dielectric layer 505 can be deposited after depositing the SAM 404 on the exposed metal areas, according to one or more embodiments of the present invention, the dielectric layer 505 is selectively deposited directly onto the ultra-low k dielectric layer 202 (and into the via 303) without using the SAM 404 to protect the exposed metal. For example, precursors with a higher inherent reactivity on dielectrics compared to metals can be used.

Figure 12:
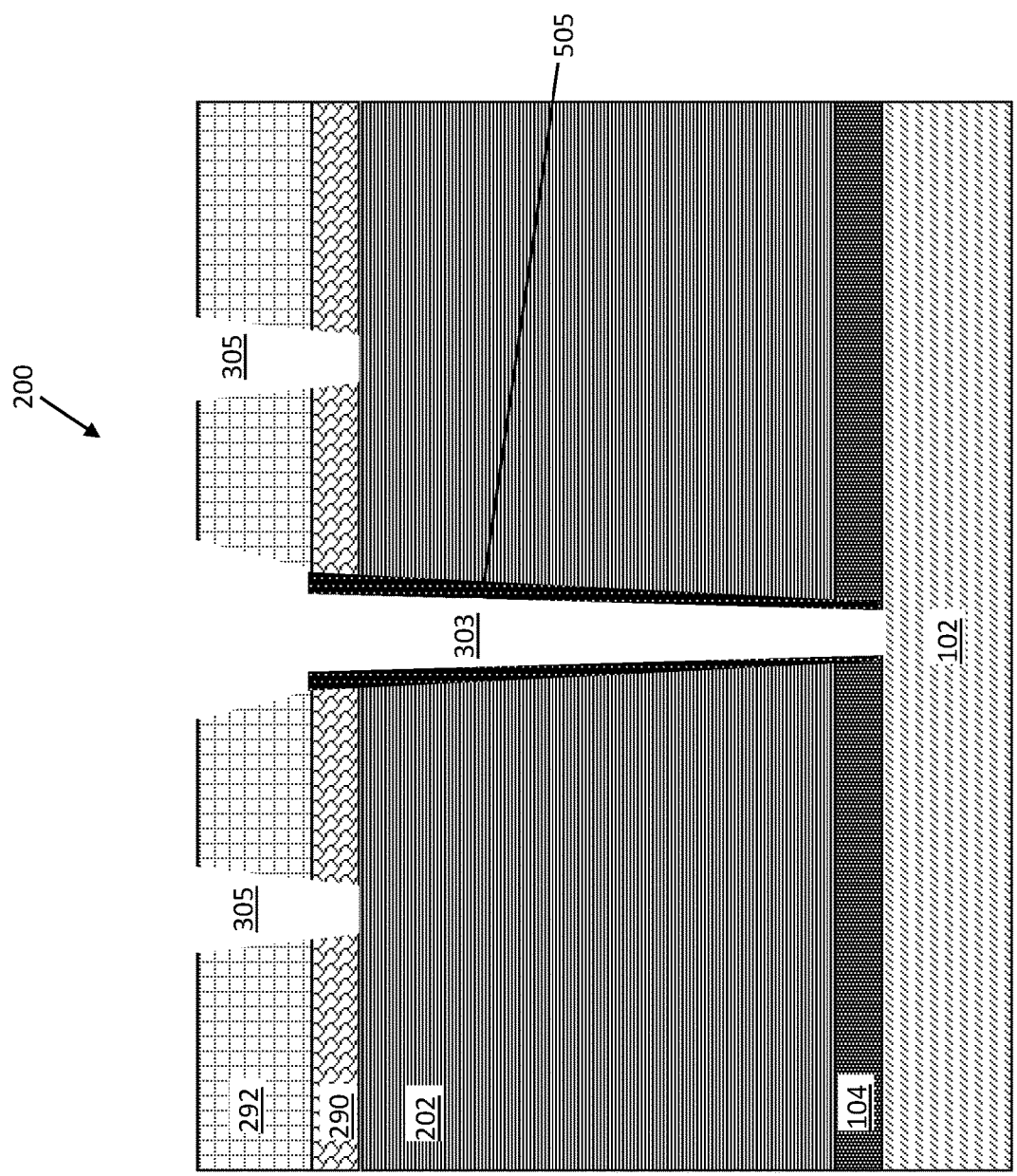

FIG. 12 depicts a cross-sectional side view subsequent to removing the SAM 404 from the metal layers 102, 292. The methods used to remove the SAM 404 depend on the composition of the SAM 404.

Figure 13B:
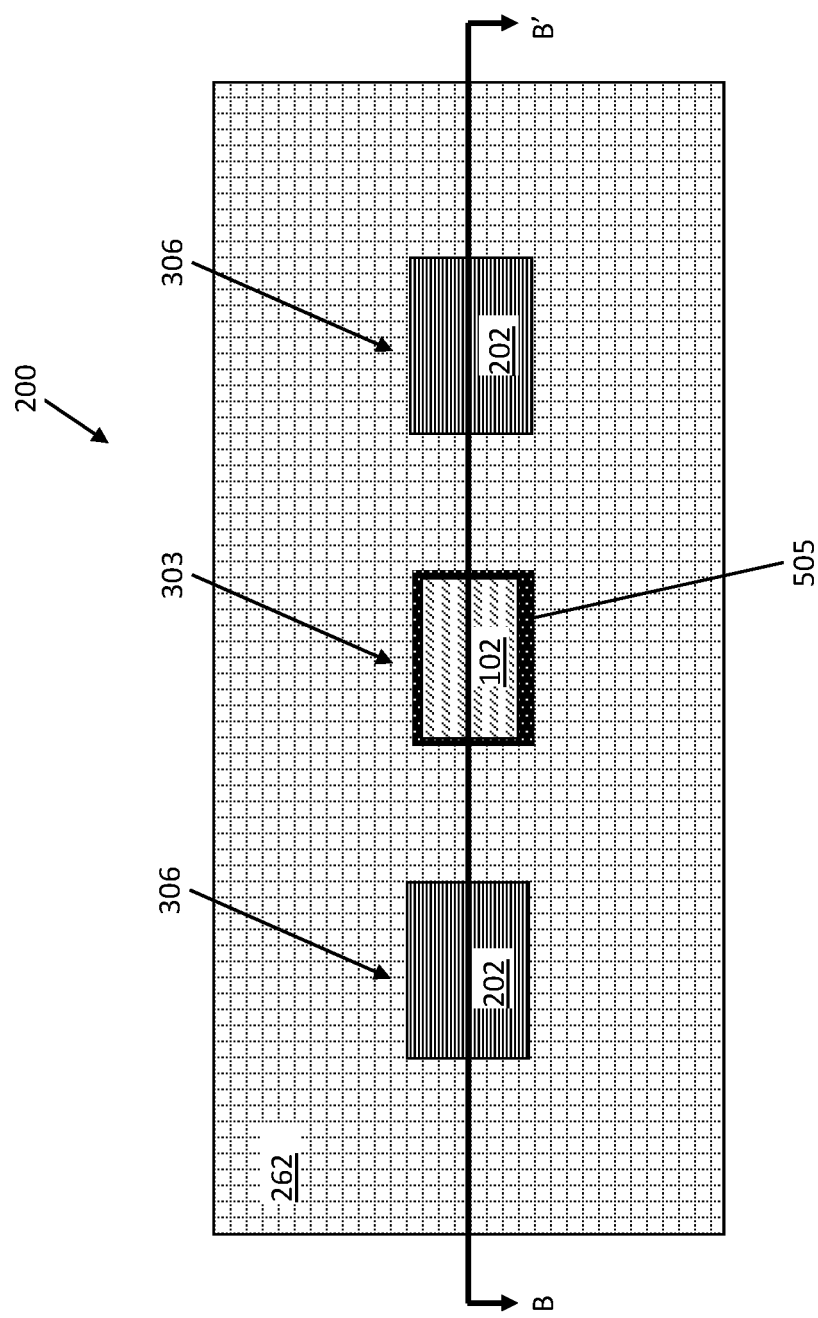
FIG. 13B depicts a top view of the semiconductor device shown in FIG. 13A, which shows a view through the B-B' axis.

FIG. 13A depicts a cross-sectional side view of the semiconductor device 200 subsequent to forming a pair of trenches 306 in the ultra-low k dielectric layer 202. FIG. 13B depicts a top view of the semiconductor device shown in FIG. 13A, which shows a view through the B-B' axis.

The pattern of the openings 305 are used to form the trenches 306 by removing portions of the ultra-low k dielectric layer 202. The trenches 306 stop within the ultra-low k dielectric layer 202. Although two trenches 306 are shown, any number of trenches 306 are formed. According to one or more embodiments of the present invention, RIE is used to form the trenches 306.

Figure 14:
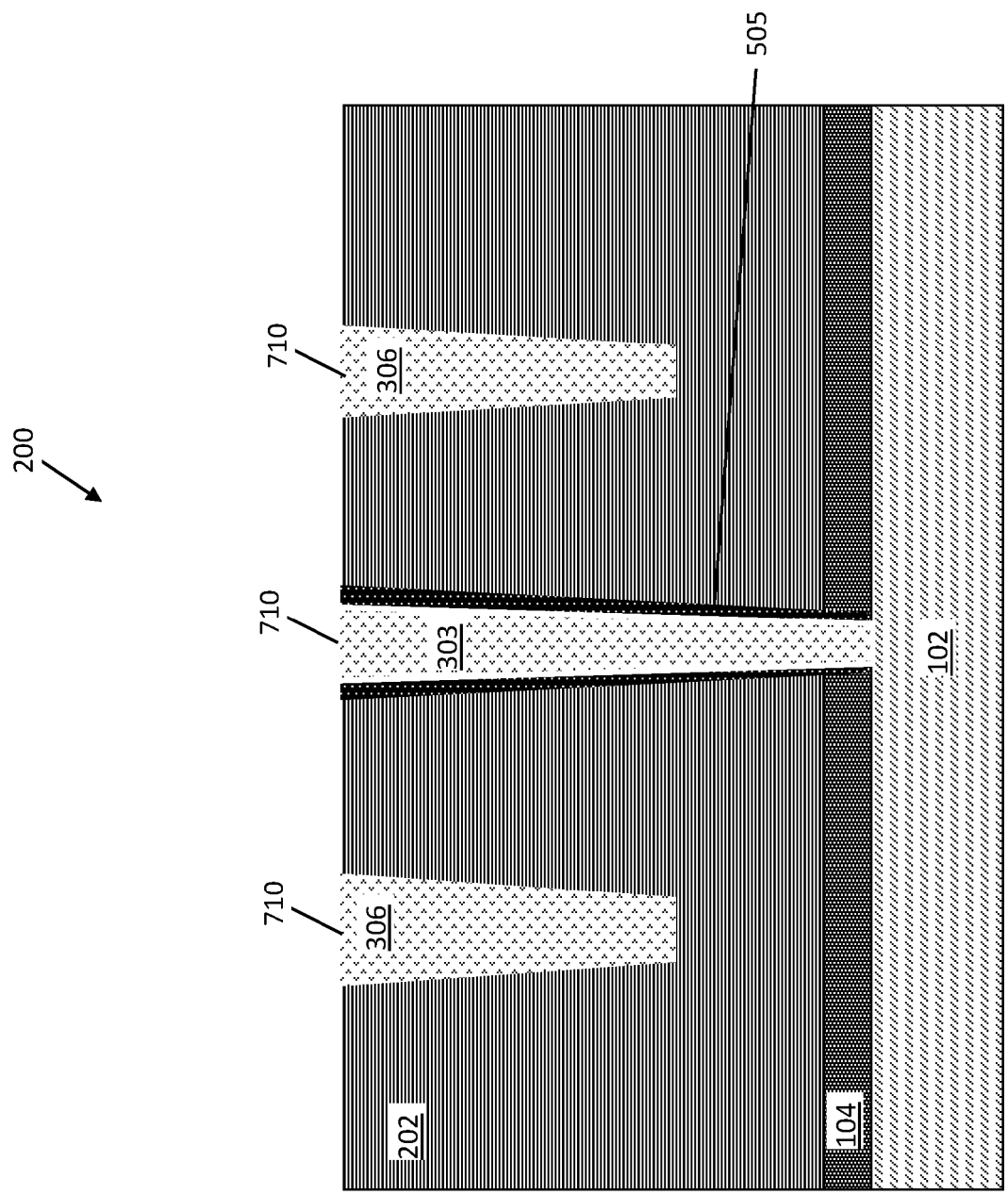

FIG. 14 depicts a cross-sectional side view of the semiconductor device 200 subsequent to depositing a metal 710 in the via 303 and the trenches 306.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
    forming a via in a first dielectric layer arranged on a metal layer, the via exposing a portion of the metal layer;
    forming a trench in the first dielectric layer;
    forming a self-assembled monolayer on the portion of the metal layer exposed by an opening in the via; and
    depositing, by a selective process, a second dielectric layer on the first dielectric layer such that the second dielectric layer lines sidewalls of the via and the trench and is selectively deposited onto the first dielectric layer.

2. The method of claim 1, wherein the dielectric layer has a k value of about 1.8 to about 4.0.

3. The method of claim 1 further comprising removing the self-assembled monolayer from the portion of the metal layer exposed by the opening.

4. The method of claim 1, wherein the trench stops within the first dielectric layer.

5. The method of claim 1, wherein depositing the second dielectric layer comprises depositing a precursor with a higher inherent reactivity on the first dielectric layer compared to the metal layer.

6. The method of claim 1, wherein the second dielectric layer comprises $SiO_2$, SiN, SiOC, hydrogenated silicon carbon oxide (SiCOH), SiCH, SiCNH, high density plasma oxide, borophosphosilicate glass (BPSG), $TiO_2$, TiSiO, ZrO, ZnO, or $Al_2O_3$.

7. A method of fabricating a semiconductor device, the method comprising:
    forming an opening through a metal layer and a first dielectric layer;
    forming a self-assembled monolayer on exposed surfaces of the metal layer; and
    depositing, by a selective process, a second dielectric layer on the first dielectric layer such that the second dielectric layer lines sidewalls of the opening and is selectively deposited onto the first dielectric layer.

8. The method of claim 7, wherein the first dielectric layer has a k value of about 1.8 to about 4.0.

9. The method of claim 7 further comprising, subsequent to depositing the second dielectric layer, removing the self-assembled monolayer from the metal layer.

10. The method of claim 7 further comprising, subsequent to depositing the second dielectric layer, forming a second opening in the metal layer.

11. The method of claim 7, wherein depositing the second dielectric layer comprises depositing a precursor with a higher inherent reactivity on the first dielectric layer compared to the metal layer.

12. A semiconductor device comprising:
    an opening within a first dielectric layer that extends to and exposes a portion of a metal layer;
    a self-assembled monolayer on portion of the metal layer that is exposed by the opening; and
    a second dielectric layer selectively contacting the first dielectric layer and lining sidewalls of the trench.

13. The semiconductor device of claim 12, wherein the first dielectric layer has a k value of about 1.8 to about 4.0.

14. The semiconductor device of claim 12 further comprising a metal filling the opening.

15. The semiconductor device of claim 12 further comprising a second opening in the first dielectric layer.

16. The semiconductor device of claim 15, wherein the second opening stops in the first dielectric layer.

17. The semiconductor device of claim 16, wherein the second dielectric layer is also deposited onto sidewalls of the second opening.

\* \* \* \* \*